(12) United States Patent   (10) Patent No.: US 6,245,605 B1
Hwang et al.                 (45) Date of Patent:    Jun. 12, 2001

(54) METHOD TO PROTECT METAL FROM OXIDATION DURING POLY-METAL GATE FORMATION IN SEMICONDUCTOR DEVICE MANUFACTURING

(75) Inventors: Ming Hwang; Wei-Yung Hsu, both of Dallas; Chih-Chen Cho, Richardson; Dirk N. Anderson, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/369,132

(22) Filed: Aug. 5, 1999

Related U.S. Application Data

(60) Provisional application No. 60/102,272, filed on Sep. 29, 1998.

(51) Int. Cl.[7] .................... H01L 21/8238; H01L 21/322; H01L 21/3205; H01L 21/4763
(52) U.S. Cl. .................. 438/216; 438/471; 438/591
(58) Field of Search .................. 438/301, 784, 438/796, 471, 216, 591, 570

(56) References Cited

U.S. PATENT DOCUMENTS

| | | | |
|---|---|---|---|
| 5,175,124 | * 12/1992 | Winebarger | 437/180 |
| 5,185,085 | * 2/1993 | Cathey, Jr. | 156/656 |
| 5,451,291 | * 9/1995 | Park et al. | 156/644.1 |

FOREIGN PATENT DOCUMENTS

59225531A  * 12/1984 (JP) .

* cited by examiner

*Primary Examiner*—John F. Niebling
*Assistant Examiner*—Walter L. Lindsay, Jr.
(74) *Attorney, Agent, or Firm*—Jacqueline J. Garner; W. James Brady, III; Frederick J. Telecky, Jr.

(57) ABSTRACT

A method for protecting metal (112) from oxidation during various oxidation steps such as CVD SiO2 oxidation for forming an overlying oxide layer (114), smile oxidation, and sidewall (116) deposition. The gas CO2 is added to the oxidation chemistry. The CO2/H2 ratio is controlled for selective oxidation. The metal (112) is effectively protected from oxidation due to the existence of both H2 and CO2 as strong reduction reagents.

15 Claims, 1 Drawing Sheet

METHOD TO PROTECT METAL FROM OXIDATION DURING POLY-METAL GATE FORMATION IN SEMICONDUCTOR DEVICE MANUFACTURING

This application claims priority under 35 USC §119(e)(1) of provisional application No. 60/102,272 filed Sep. 29, 1998.

FIELD OF THE INVENTION

The invention is generally related to the field of forming field effect transistors and more specifically to a method of forming a field effect transistor having a poly-metal gate.

BACKGROUND OF THE INVENTION

As semiconductor devices continue to scale to smaller and smaller dimensions, resistance in the gate electrode lines of field effect transistors becomes a concern. One way to reduce the resistance in a gate electrode is to use a combination of polysilicon and metal. These are known as poly-metal gates. The gate stack consists of a gate dielectric, a polysilicon layer, a barrier layer and a metal layer.

Three oxidation steps are desirable during the gate formation. The first is a chemical vapor deposition (CVD) of silicon dioxide over the metal layer prior to the gate stack etch. The second is a light thermal reoxidation (sometimes referred to as a "poly smile" oxidation) after gate etch to remove the etch damage. The third is a sidewall CVD-SiO2 deposition after the gate etch.

The oxidation of silicon (including polysilicon) is self-limiting in the presence of these three oxidation steps. That is, only a small portion of the silicon will oxidize. Unfortunately, metals, such as tungsten, are not self-limiting. Accordingly, the tungsten may completely oxidize and even vaporize during any of these oxidation processes.

One prior art method of selective oxidation for poly-metal gate formation was proposed by Kobayashi et al (Proc. of 15$^{th}$ Conf. Solid State Devices and Material p. 217 (1983)). In this method, a wet hydrogen oxidation procedure was developed to allow the silicon to oxidize while leaving the tungsten unaffected in a post gateetch oxidation. The method is based on thermodynamic calculations which show that at, for example, 1000° C. and a P(H2O)/P(H2) ratio (partial pressure ratio of H20 and H2) of 1.0e-05, the equilibrium:

prefers the right side of the reaction, i.e., oxidation of Si and

prefers the left side of the reaction, i.e., reduction of WO3 to W. Therefore, under appropriate conditions, it is possible to oxidize silicon again such that the oxidation rate of W will be prevented.

Unfortunately, it is difficult to generate a uniform steam of pure H2O without heavy metal contaminants because it is hard to completely remove heavy metal from the clean and deionized water used in steam generators for semiconductor device manufacturing. It is also dangerous to generate and control a proper H2/H2O gas ratio using a burning process of mixed oxygen and hydrogen under an excessive hydrogen environment.

The above process has been proposed for light thermal oxidation. Selective CVD of oxide is also desirable in forming poly-metal gates. In the area of non-selective CVD-SiO2, several CO2-H2 gas chemistries have been proposed. One such gas chemistry is SiH4-CO2-H2 and another is SiH2Cl2-CO2-H2. A CO2-H2 gas chemistry has also been used to produce H2O for H2O addition reactions such as 2AlCl3+3H2O→Al2O3+6HCl. In addition, CO gas has been used in metallurgy as a strong reduction reagent of metal oxides for metal production.

There is a need for both selective thermal oxidation and selective CVD oxidation processes that do not significantly oxidize metal.

SUMMARY OF THE INVENTION

A method for protecting metal from oxidation during various oxidation steps such as CVD SiO2 deposition for forming an overlying oxide layer, smile oxidation, and/or sidewall deposition. A CO2 gas is added to the oxidation chemistry. The CO2/H2 gas ratio is controlled for selective oxidation. Thus, the metal is effectively protected from oxidation due to the existence of both H2 and CO2 as strong reduction reagents.

An advantage of the invention is providing a method for selectively forming an oxide in the presence of a metal without significantly oxidizing the metal.

This and other advantages will be apparent to those of ordinary skill in the art having reference to the specification in conjunction with the drawings.

DETAILED DESCRIPTION OF THE EMBODIMENTS

The invention will now be described in conjunction with a process for forming poly-metal gate for a MOSFET transistor. It will be apparent to those of ordinary skill in the art that the benefits of the invention may be applied to other processes requiring protection for a metal layer during oxidation steps.

In conventional CVD-SiO2 deposition processes, reactions of SiH4 (mono-silane) or SiH2Cl2 (dichlorosilane) with oxidation reagents such as O2, H2O, N2O, etc., (as well as TEOS (TetraEthylOrthoSilicate) in a thermal decomposition process) are popularly used in semiconductor device manufacturing. When such processes are applied to a poly-metal gate formation, the exposed metal will be easily oxidized due to the existence of oxidation reagents and the absence of reduction reagents in the process.

It is known that SiH4-CO2-H2 and SiH2Cl2-CO2-H2 may be used to form SiO2 using a blanket CVD process. The first embodiment of the invention uses a CO2/H2 gas ratio in a selective CVD oxidation process to protect metal during oxidation. Protection is achieved because H2 and CO are strong reduction reagents. The oxidation-reduction reactions are as follows:

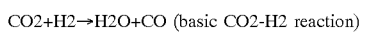

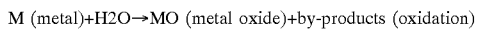

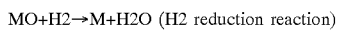

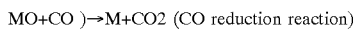

By controlling the CO2/H2 gas ratio in the above-mentioned CVD-SiO2 processes, the metal will be effectively protected from oxidation due to the existence of both H2 and CO as strong reduction reagents. The CO2/H2 ratio range depends on the material and the selective oxidation temperature, which can be chosen based on thermodynamic calculations. The typical temperature is between 500–1100° C. For the case with W as the gate electrode, a typical CO2/H2 ratio is 1E-4 to 1E-1 at a temperature of 727° C. The time duration depends on the thickness of the SiO2 film thickness required. The thicker the film, the longer the time needed.

In a second embodiment of the invention, the CO2-H2 reaction is used for the light thermal oxidation (instead of a CVD process) after gate etch to protect metal from oxidation in the following oxidation-reduction process:

CO2+H2→H2O+CO (basic CO2-H2 reaction)

Si+H2O→SiO2+H2 (oxidation)

M (metal)+H2O→MO (metal oxide)+H2 (oxidation)

MO+H2→M+H2O (H2 reduction reaction)

MO+CO→M+CO2 (CO reduction reaction)

By controlling the CO2/H2 gas ratio in this light thermal process, the metal is also effectively protected from oxidation due to the existence of both H2 and CO as strong reduction reagents.

In the prior art selective light thermal oxidation using H2O and H2, the following reactions take place:

Si+H2O→SiO2+H2 (oxidation)

M (metal)+H2O MO (metal oxide)+H2 (oxidation)

MO+H2→M+H2O (H2 reduction reaction)

In addition to the problems discussed in the background, without the additional reduction reagent like CO as in the invention, the reaction must sacrifice the silicon oxidation rate at a given high temperature to protect the metal from oxidation.

Figure 1A:
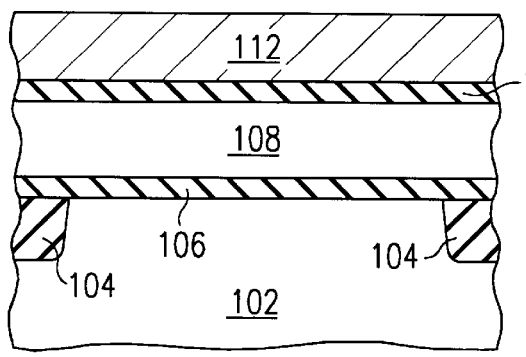
FIGS. 1A–1F are cross-sectional diagrams of a portion of an integrated circuit incorporating the first and second embodiments of the invention at various stages of fabrication.

A process incorporating the first and second embodiments of the invention will now be discussed with reference to FIGS. 1A–1F. Referring to FIG. 1A, an integrated circuit is processed through the formation of metal layer 112. This includes any well regions, threshold adjust implants, etc., (not shown) in semiconductor body 102, as well as the formation of isolation regions 104. A gate dielectric 106, for example silicon dioxide, is formed on semiconductor body 102 and a polysilicon layer 108 is formed on gate dielectric 106. A barrier layer 110, such as tungsten-nitride (WN) is formed over polysilicon layer 108. Metal layer 112, for example W, is formed over barrier layer 110. The thickness of gate dielectric 106 may be in the range of 25–200 Å. The thickness of polysilicon layer 108 may be in the range of 500–1500 Å. The thickness of barrier layer 110 may be in the range of 25–200 Å and the thickness of metal layer 112 may be in the range of 500–2500 Å. As will be apparent to those of ordinary skill in the art, the thicknesses of these layers will vary depending on the technology node and materials used.

Figure 1B:
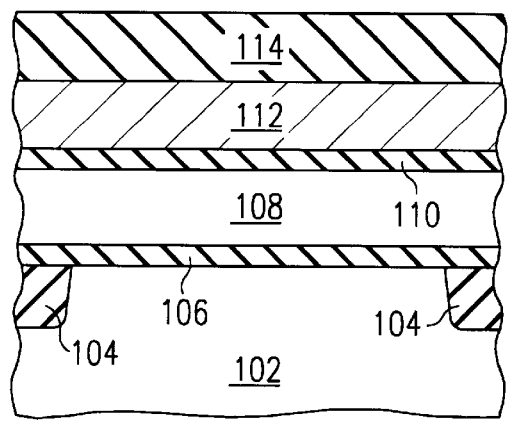

Referring to FIG. 1B, a first silicon-dioxide layer 114 may be formed over metal layer 112. First silicon dioxide layer 114 is an optional layer and is sometimes used in conjunction with self-aligned contacts. (Nitride is sometimes also used in place of the oxide for self-aligned contacts.) If self-aligned contacts are not desired, silicon-dioxide layer 114 may be omitted. First silicon-dioxide layer 114 is formed by selective CVD according to the first embodiment of the invention. The thickness of first silicon-dioxide layer 114 may be in the range of 500–2500 Å. The selective CVD uses a gas chemistry that includes CO2 and H2. For example, silane or dichlorosilane may be combined with CO2 and H2. As described above, the reactions produce CO and H2 as reduction reagents that protect the metal from oxidation while the SiO2 is deposited. The CO2/H2 ratio range depends on the material and the selective oxidation temperature, which can be chosen based on thermodynamic calculations. The typical temperature is between 500–1100° C. For the case with W as the gate electrode, a typical CO2/H2 ratio is 1E-4 to 1E-1 at a temperature of 727° C. The time duration depends on the thickness of the SiO2 film thickness required. The thicker the film, the longer the time needed.

Figure 1C:
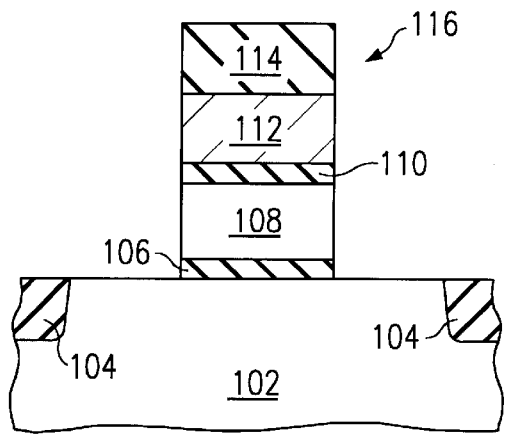
Figure 1D:
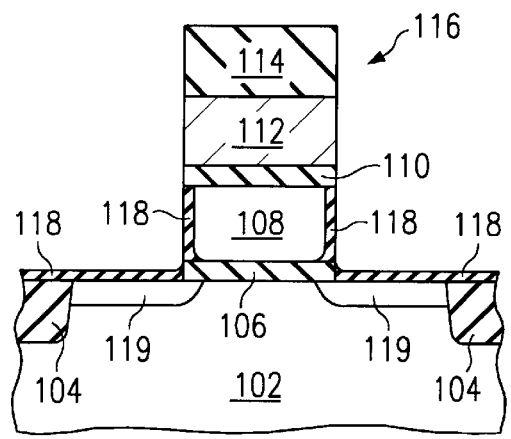

Referring to FIG. 1C, the optional first SiO2 layer 114, metal layer 112, barrier layer 110, polysilicon layer 108 and gate dielectric 106 are patterned and etched to form gate stack 116. At this point, a light thermal oxidation according to the second embodiment of the invention is performed to reduce etch damage, as shown in FIG. 1D. The light thermal oxidation is sometimes referred to as a poly-smile oxidation. The poly-smile oxidation results in a small portion 118 of the edge of polysilicon layer 108 being oxidized. (A portion of the substrate may also be oxidized.) A gas ratio of CO2 and H2 is used for the poly-smile oxidation. The CO2/H2 gas chemistry forms an oxidizing reagent, H2O and CO. The oxidizing reagent reacts with the silicon and polysilicon to form SiO2 and H2. The CO and H2 are reduction reagents that protect the exposed sidewalls of metal layer 112 from oxidation.

Figure 1E:
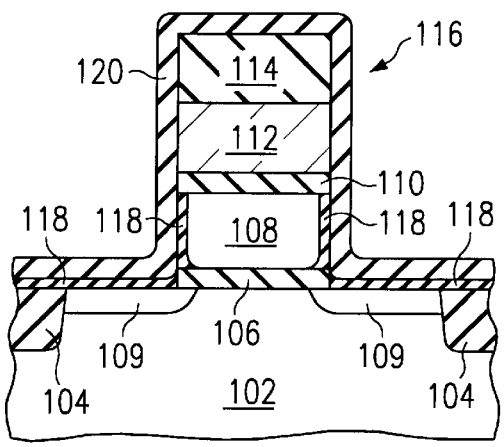
Figure 1F:
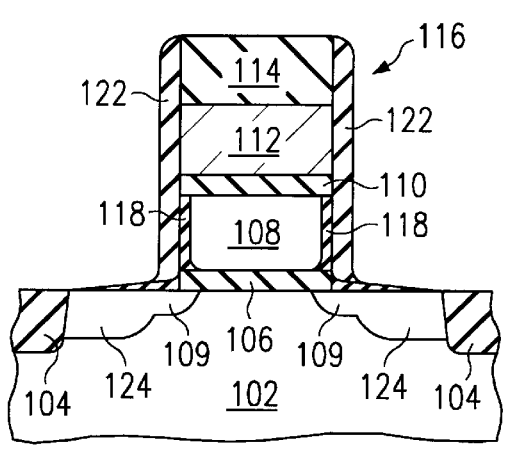

After any drain extension 119 implants, a second oxide layer 120 is formed over the structure, as shown in FIG. 1E. The thickness of second oxide layer 120 is in the range of 200–2000 Å. Second oxide layer 120 is formed by selective CVD according to the first embodiment of the invention. A CO2/H2 gas chemistry is combined with mono-silane or dichlorosilane. Again, the production of CO and H2 from the thermodynamic reactions protects the exposed sidewalls of metal layer 112 from oxidation. The second oxide layer 120 is then anisotropically etched to form sidewall spacers 122 are the sidewalls of gate stack 116, as shown in FIG. 1F. Source/drain 124 implants may then be performed followed by contact and interconnect formation as is known in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit, comprising the steps of:
    forming a metal layer over a structure;
    selectively oxidizing said structure with at least a portion of said metal layer exposed using a first chemistry that comprises $CO_2$ and $H_2$ to substantially protect said metal layer from oxidation.

2. The method of claim 1, wherein said metal structure is part of a gate electrode.

3. The method of claim 1, wherein said selectively oxidizing step forms a first oxide layer over said metal layer.

4. The method of claim 3, further comprising the steps of forming a second oxide layer over said gate stack using a second chemistry comprising CO2 and H2 to protect said metal layer; and anisotropically etching said second oxide layer to form a sidewall spacer of sidewalls of said gate stack.

5. The method of claim 4, further comprising the step of performing a light thermal oxidation using a third chemistry comprising CO2 and H2 to protect said metal layer.

6. The method of claim 1, further comprising the steps of:

forming a gate dielectric on a semiconductor body;

forming a polysilicon layer over said gate dielectric;

forming a barrier layer over said polysilicon layer, wherein said metal layer is formed on said barrier layer; and patterning and etching said metal layer, said barrier layer, said polysilicon layer and said gate dielectric to form a gate stack.

7. The method of claim 6, further comprising the step of performing a light thermal oxidation using a second chemistry comprising CO2 and H2 to protect said metal layer.

8. The method of claim 7, wherein said selectively oxidizing step forms a first oxide layer over said metal layer and further comprising the step of anisotropically etching said first oxide layer to form a sidewall spacer on sidewalls of said gate stack.

9. The method of claim 1, wherein said first chemistry comprises silane, CO2, and H2.

10. The method of claim 1, wherein said first chemistry comprises dichlorosilane, CO2, and H2.

11. A method of fabricating an integrated circuit comprising the steps of:

forming a gate stack comprising a gate dielectric, a polysilicon layer, a barrier layer, and a metal layer;

performing a re-oxidation using a $CO_2$ and $H_2$ gas ratio to selectively oxidize a portion of the polysilicon layer with respect to the metal layer;

depositing, by selective chemical vapor deposition, a layer of silicon dioxide over the gate stack using a gas chemistry comprising a siliane, $CO_2$ and $H_2$ without significantly oxidizing said metal layer; and anisotropically etching said layer of silicon dioxide to form a sidewall spacer on a sidewall of said gate stack.

12. The method of claim 11, wherein said silane comprises dichlorosilane.

13. The method of claim 11, further comprising the step of forming source/drain regions in said semiconductor body adjacent said sidewall spacer.

14. A method of fabricating an integrated circuit comprising the steps of:

forming a gate stack comprising a gate dielectric, a polysilicon layer, a barrier layer, and a metal layer; and performing a re-oxidation using a $CO_2$ and $H_2$ gas ratio to selectively oxidize a portion of the polysilicon layer with respect to the metal layer;

wherein said step of forming the gate stack further comprises the step of forming, by selective chemical vapor deposition, an oxide layer over said metal layer using a gas chemistry comprising a silane, $CO_2$ and $H_2$ to prevent significant oxidation of said metal layer.

15. The method of claim 14, wherein said silane comprises dichlorosilane.

* * * * *